United States Patent
Fujimori

(10) Patent No.: US 11,177,788 B2
(45) Date of Patent: Nov. 16, 2021

(54) ACOUSTIC WAVE DEVICE, RADIO FREQUENCY FRONT-END MODULE, AND COMMUNICATION DEVICE

(71) Applicant: Murata Manufacturing Co., Ltd., Nagaokakyo (JP)

(72) Inventor: Eiji Fujimori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 19 days.

(21) Appl. No.: 16/451,088

(22) Filed: Jun. 25, 2019

(65) Prior Publication Data

US 2019/0312563 A1 Oct. 10, 2019

Related U.S. Application Data

(63) Continuation of application No. PCT/JP2017/043419, filed on Dec. 4, 2017.

(30) Foreign Application Priority Data

Dec. 26, 2016 (JP) .............................. JP2016-251236

(51) Int. Cl.
*H03H 9/25* (2006.01)
*H03H 9/64* (2006.01)
(Continued)

(52) U.S. Cl.
CPC ........ *H03H 9/02818* (2013.01); *H03H 9/145* (2013.01); *H03H 9/25* (2013.01); *H03H 9/64* (2013.01); *H03H 9/72* (2013.01)

(58) Field of Classification Search
CPC ............ H03H 9/72; H03H 9/725; H03H 9/64; H03H 9/25; H03H 9/0547
See application file for complete search history.

(56) References Cited

U.S. PATENT DOCUMENTS 7,378,922 B2 * 5/2008 Kubo .................. B81C 1/00238
                                                333/133
9,130,539 B2 * 9/2015 Kikuchi ................. H03H 9/725
(Continued)

FOREIGN PATENT DOCUMENTS

JP   2000-236230 A   8/2000
JP   2001-345673 A   12/2001
(Continued)

OTHER PUBLICATIONS

Official Communication issued in corresponding Japanese Patent Application No. 2018-558946, dated Jun. 2, 2020.
(Continued)

*Primary Examiner* — Dean O Takaoka
*Assistant Examiner* — Alan Wong
(74) *Attorney, Agent, or Firm* — Keating & Bennett, LLP

(57) ABSTRACT

An acoustic wave device includes a first and second element substrates each having piezoelectricity, and bonding layers bonding the first and second element substrates to each other. First and second IDT electrodes and first and second wiring electrodes are respectively provided on the first and second element substrates. The first and second wiring electrodes are disposed one above the other with the bonding layer interposed therebetween to define a wiring electrode overlapped portion. In each of the wiring electrode overlapped portions, the first wiring electrode and the second wiring electrode are provided in one of combinations in which one wiring electrode is a signal wiring electrode and the other wiring electrode is a ground wiring electrode, both of the wiring electrodes are ground wiring electrodes, and both of the wiring electrodes are signal wiring electrodes at the same potential.

19 Claims, 10 Drawing Sheets

(51) Int. Cl.
*H03H 9/72* (2006.01)
*H03H 9/02* (2006.01)
*H03H 9/145* (2006.01)

(56) References Cited

U.S. PATENT DOCUMENTS

| | | | |
|---|---|---|---|
| 10,171,064 B2 * | 1/2019 | Nakamura | H03H 9/14541 |
| 10,243,535 B2 * | 3/2019 | Kawasaki | H03H 9/725 |
| 10,284,177 B2 * | 5/2019 | Caron | H03F 3/72 |
| 10,396,757 B2 * | 8/2019 | Kakita | H01L 23/53242 |
| 2009/0224851 A1 | 9/2009 | Feiertag et al. | |
| 2012/0306593 A1 | 12/2012 | Kidoh | |
| 2015/0109071 A1 | 4/2015 | Kikuchi et al. | |
| 2017/0294895 A1 | 10/2017 | Kakita et al. | |
| 2017/0331455 A1 | 11/2017 | Kuroyanagi | |

FOREIGN PATENT DOCUMENTS

| | | |
|---|---|---|
| JP | 2007-060465 A | 3/2007 |
| JP | 2008-546207 A | 12/2008 |
| JP | 2015-091065 A | 5/2015 |
| JP | 2017-188807 A | 10/2017 |
| JP | 2017-204827 A | 11/2017 |
| WO | 2011/102049 A1 | 8/2011 |
| WO | 2014/034326 A1 | 3/2014 |

OTHER PUBLICATIONS

Official Communication issued in International Patent Application No. PCT/JP2017/043419, dated Feb. 6, 2018.

* cited by examiner

ACOUSTIC WAVE DEVICE, RADIO FREQUENCY FRONT-END MODULE, AND COMMUNICATION DEVICE

CROSS REFERENCE TO RELATED APPLICATIONS

This application claims the benefit of priority to Japanese Patent Application No. 2016-251236 filed on Dec. 26, 2016 and is a Continuation Application of PCT Application No. PCT/JP2017/043419 filed on Dec. 4, 2017. The entire contents of each application are hereby incorporated herein by reference.

BACKGROUND OF THE INVENTION

1. Field of the Invention

The present invention relates to an acoustic wave device, and more particularly, to an acoustic wave device inside of which interference between signals is reduced or prevented.

The present invention further relates to a radio frequency front-end module, and more particularly, to a radio frequency front-end module including the acoustic wave device according to the present invention.

The present invention still further relates to a communication device, and more particularly, to a communication device including the acoustic wave device according to the present invention or the radio frequency front-end module according to the present invention.

2. Description of the Related Art

In order to reduce the size of an acoustic wave device in a plane direction, a plurality of element substrates each having piezoelectricity are often located one above another and bonded to each other with a certain distance maintained between the adjacent element substrates. For example, in an acoustic wave device (thin-film surface acoustic wave device) 1000 illustrated in FIG. 11 and disclosed in Japanese Unexamined Patent Application Publication No. 2007-60465, a first element substrate (substrate) 101 and a second element substrate (substrate) 102 are located one above the other and bonded to each other with a certain distance maintained therebetween and with a bonding layer (bonding portion) 109 interposed therebetween.

An external connection electrode 103 is formed on a lower principal surface of the first element substrate 101, and a metal bump 104 is formed on the underside of the external connection electrode 103. An IDT (Inter Digital Transducer) electrode (excitation electrode) 105 is formed on an upper principal surface of the first element substrate 101. A wiring electrode 106 extends from the IDT electrode 105. An IDT electrode (excitation electrode) 107 is formed on a lower principal surface of the second element substrate 102. A wiring electrode 108 extends from the IDT electrode 107. The wiring electrode 108 extends up to the side including the first element substrate 101 through the inside or over a lateral surface of the bonding layer 109.

In an attempt to reduce the size of the acoustic wave device 1000 in the plane direction as much as possible, the wiring electrode 106 extending from the IDT electrode 105 in the first element substrate 101 and the wiring electrode 108 extending from the IDT electrode 107 in the second element substrate 102 may be arranged in an overlapping relationship when viewed in plan.

If the wiring electrode 106 and the wiring electrode 108 overlap each other when viewed in plan, a signal flowing in the wiring electrode 106 and a signal flowing in the wiring electrode 108 may cause interference in some cases when a combination of the wiring electrode 106 and the wiring electrode 108 is provided by signal wiring electrodes at different potentials.

The interference between the signal flowing in the wiring electrode 106 and the signal flowing in the wiring electrode 108 may give rise to a problem that electrical characteristics of the acoustic wave device 1000 are degraded, or that a malfunction occurs in an electronic device using the acoustic wave device 1000.

SUMMARY OF THE INVENTION

A preferred embodiment of the present invention provides an acoustic wave device including a first element substrate having piezoelectricity in at least a portion thereof, a first IDT electrode provided on one principal surface of the first element substrate, a second element substrate stacked on the first element substrate and having piezoelectricity in at least a portion thereof, a second IDT electrode provided on one principal surface of the second element substrate, a bonding layer made of an insulator and provided between the first element substrate and the second element substrate, at least one first wiring electrode extending from the first IDT electrode, and at least one second wiring electrode extending from the second IDT electrode, the second wiring electrode extending to at least the one principal surface of the first element substrate after passing over a lateral surface or through the inside of the bonding layer, wherein the first wiring electrode and the second wiring electrode overlap with each other when viewed in plan, and the first wiring electrode and the second wiring electrode are provided in one of combinations that one wiring electrode is a signal wiring electrode and the other wiring electrode is a ground wiring electrode, that both the wiring electrodes are ground wiring electrodes, and that both the wiring electrodes are signal wiring electrodes at the same potential.

Preferably, the principal surface of the first element substrate on which the first IDT electrode is provided and the principal surface of the second element substrate on which the second IDT electrode is provided are opposed to each other with the bonding layer interposed therebetween. In this case, a space is able to easily be provided between both functional principal surfaces of the first element substrate and the second element substrate on which principal surfaces the IDT electrodes are provided, and free vibrations of the IDT electrodes provided on the first element substrate and the second element substrate are ensured.

In the above case, more preferably, the first wiring electrode is provided at least on the principal surface of the first element substrate on which the first IDT electrode is provided, and the second wiring electrode is provided at least on the principal surface of the second element substrate on which the second IDT electrode is provided, on the lateral surface of or inside the bonding layer, and on the principal surface of the first element substrate on which the first IDT electrode is provided. In this case, an acoustic wave device according to a preferred embodiment of the present invention is able to be easily provided.

Preferably, the first wiring electrode and the second wiring electrode are each connected to an external connection electrode provided on the first element substrate. In this case, the acoustic wave device is able to be connected to the outside through the external connection electrode. The external connection electrode may be provided, for example, at least on an end surface of the first element substrate and a principal surface of the first element substrate on which the first IDT electrode is not provided.

Preferably, the first wiring electrode is provided between the first element substrate and the bonding layer, the second wiring electrode is provided between the second element substrate and the bonding layer, and when looking at the acoustic wave device in plan, the first wiring electrode and the second wiring electrode overlap with each other in a region in which the bonding layer is provided. In this case, the first wiring electrode and the second wiring electrode are able to be easily arranged in an intersecting relationship.

Preferably, the first wiring electrode includes at least two or more wiring electrodes, the second wiring electrode includes at least two or more wiring electrodes, the first wiring electrodes and the second wiring electrodes overlap with each other at a plurality of positions when viewed in plan, and at each of the plurality of positions, each of the first wiring electrodes and each of the second wiring electrodes are provided in one of combinations that one wiring electrode is a signal wiring electrode and the other wiring electrode is a ground wiring electrode, that both the wiring electrodes are ground wiring electrodes, and that both the wiring electrodes are signal wiring electrodes at the same potential. In this case, signal interference inside the acoustic wave device is able to be more reliably reduced or prevented.

The bonding layer may be divided into a plurality of bonding layers.

Alternatively, the bonding layer may be an annular bonding layer. In this case, an enclosed space is able to be defined by the first element substrate, the second element substrate, and the bonding layer. By providing the IDT electrodes in the enclosed space, the IDT electrodes are able to be protected from external environments (such as high humidity). Furthermore, when the surroundings of the acoustic wave device are sealed using resin, the resin does not extend to the IDT electrodes, and free vibrations of the IDT electrodes are not impeded by the resin.

The number of wiring electrode overlapped portions (i.e., the positions at which the first wiring electrodes and the second wiring electrodes overlap with each other) may be optionally set, and it may be set to four, for example. Positions at which the wiring electrode overlapped portions are arranged may also be optionally set, and the wiring electrode overlapped portions may be arranged, for example, at four corners in a distributed manner.

The acoustic wave devices according to preferred embodiments of the present invention may define, for example, a filter array including a plurality of independent filters. As an alternative, the acoustic wave devices according to preferred embodiments of the present invention may define, for example, a multiplexer.

Furthermore, a radio frequency front-end module according to a preferred embodiment of the present invention may include an acoustic wave device according to a preferred embodiment of the present invention.

Moreover, a communication device according to a preferred embodiment of the present invention may include an acoustic wave device according to a preferred embodiment of the present invention or a radio frequency front-end module according to a preferred embodiment of the present invention.

In an acoustic wave device according to a preferred embodiment of the present invention, the first wiring electrode provided on the first element substrate and the second wiring electrode provided on the second element substrate in an overlapping relationship to the first wiring electrode when viewed in plan are provided in one of combinations that one wiring electrode is a signal wiring electrode and the other wiring electrode is a ground wiring electrode, that both the wiring electrodes are ground wiring electrodes, and that both the wiring electrodes are signal wiring electrodes at the same potential. Thus, a possibility of the occurrence of signal interference between the first wiring electrode and the second wiring electrode is small.

In acoustic wave devices according to preferred embodiments of the present invention, therefore, electrical characteristics are unlikely to degrade due to the signal interference. Moreover, an electronic device including an acoustic wave device according to a preferred embodiment of the present invention is unlikely to malfunction due to the signal interference inside the acoustic wave device.

In addition, the radio frequency front-end modules and the communication devices according to preferred embodiments of the present invention are also unlikely to malfunction attributable to the signal interference inside the acoustic wave device used therein.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
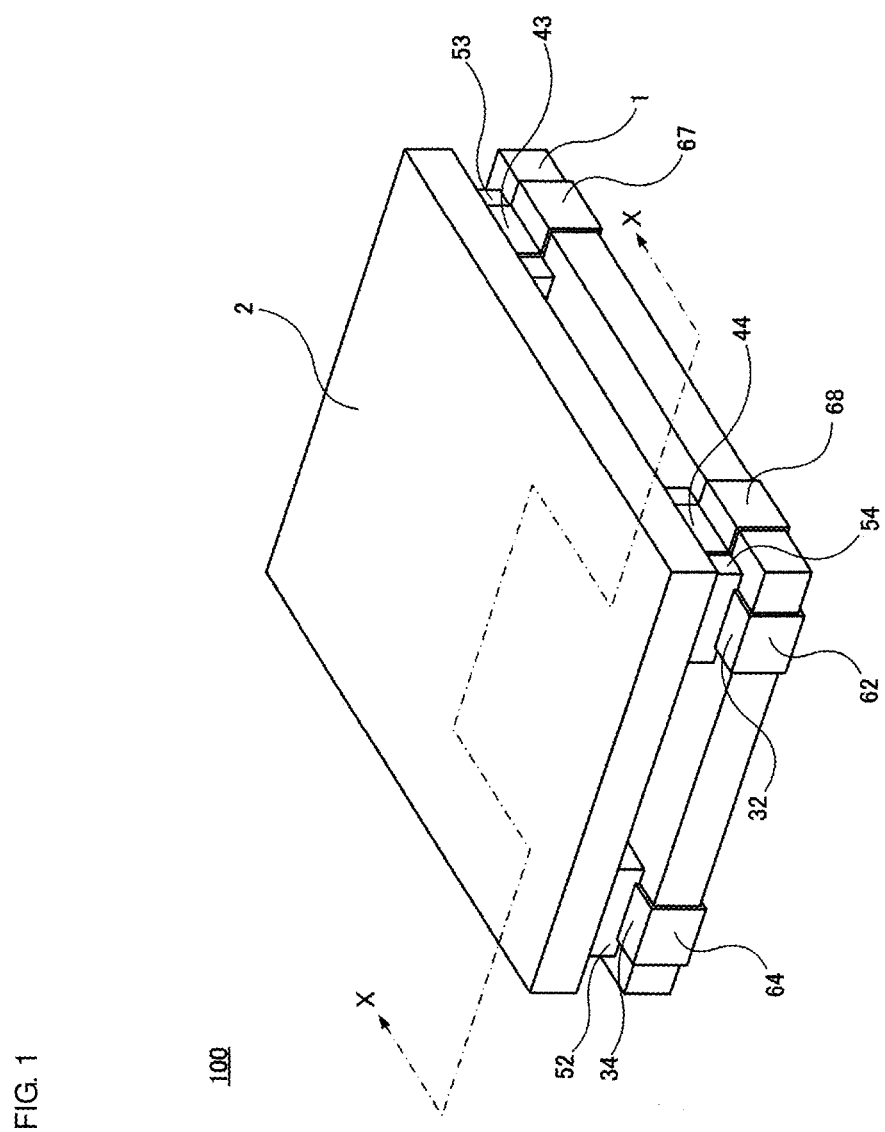
FIG. 1 is a perspective view of an acoustic wave device 100 according to a first preferred embodiment of the present invention.

Preferred embodiments of the present invention will be described below with reference to the drawings.

It is to be noted that the following description explains, by way of example, preferred embodiments of the present invention, and that the present invention is not limited to the preferred embodiments. The features and elements explained in the preferred embodiments may be used in optionally combined configurations, and those combined configurations also fall within the scope of the present invention. The drawings are intended to aid understanding of the description and are illustrated in schematic representation depending on the case. Therefore, dimensional ratios between the illustrated elements or between distances between the elements are not always coincident with those stated in the description. Moreover, the elements explained in the description are omitted in the drawings or are illustrated in number reduced from the actual one in some cases.

First Preferred Embodiment

Figure 2:
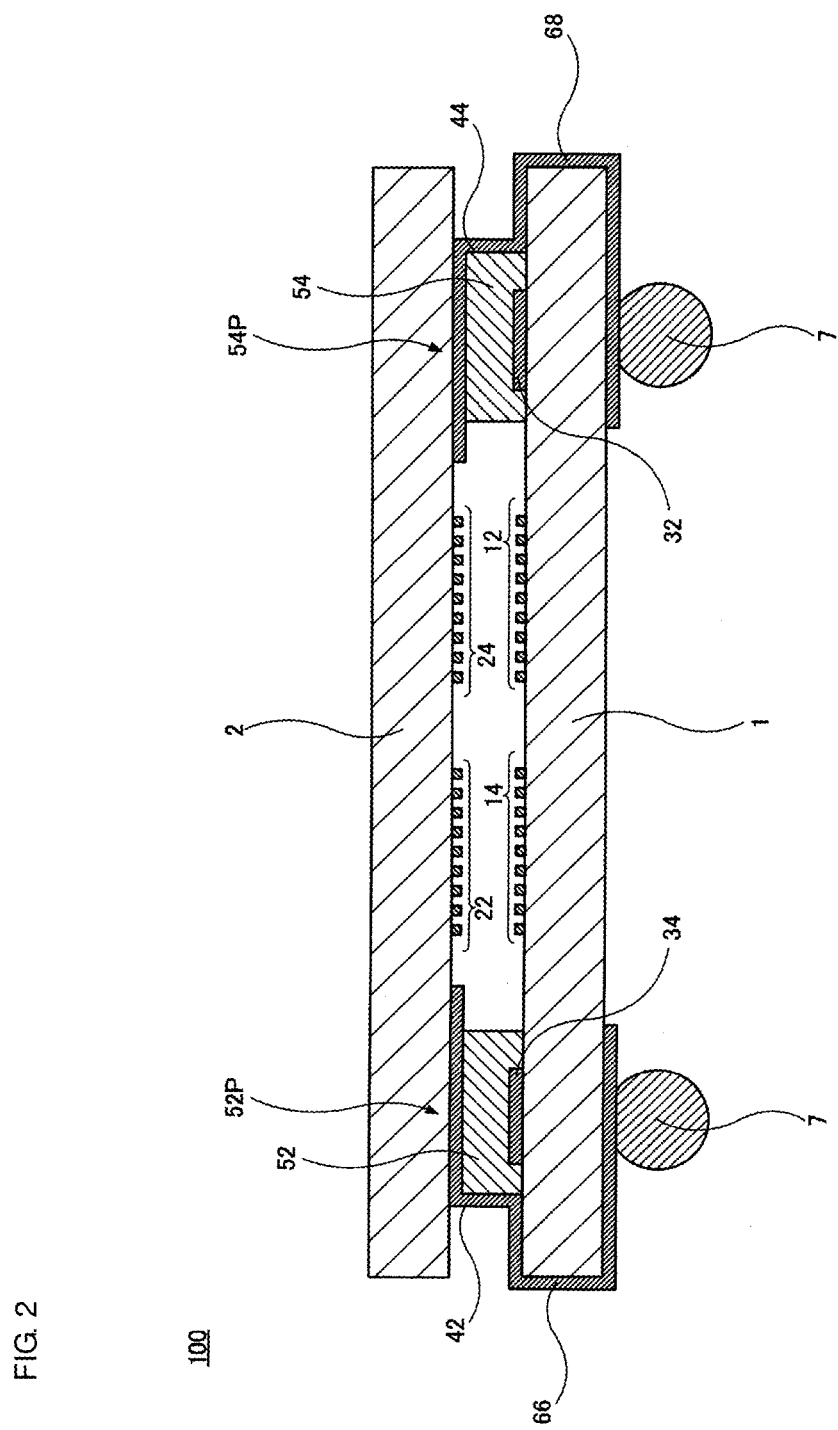
FIG. 2 is a sectional view of the acoustic wave device 100.
Figure 3:
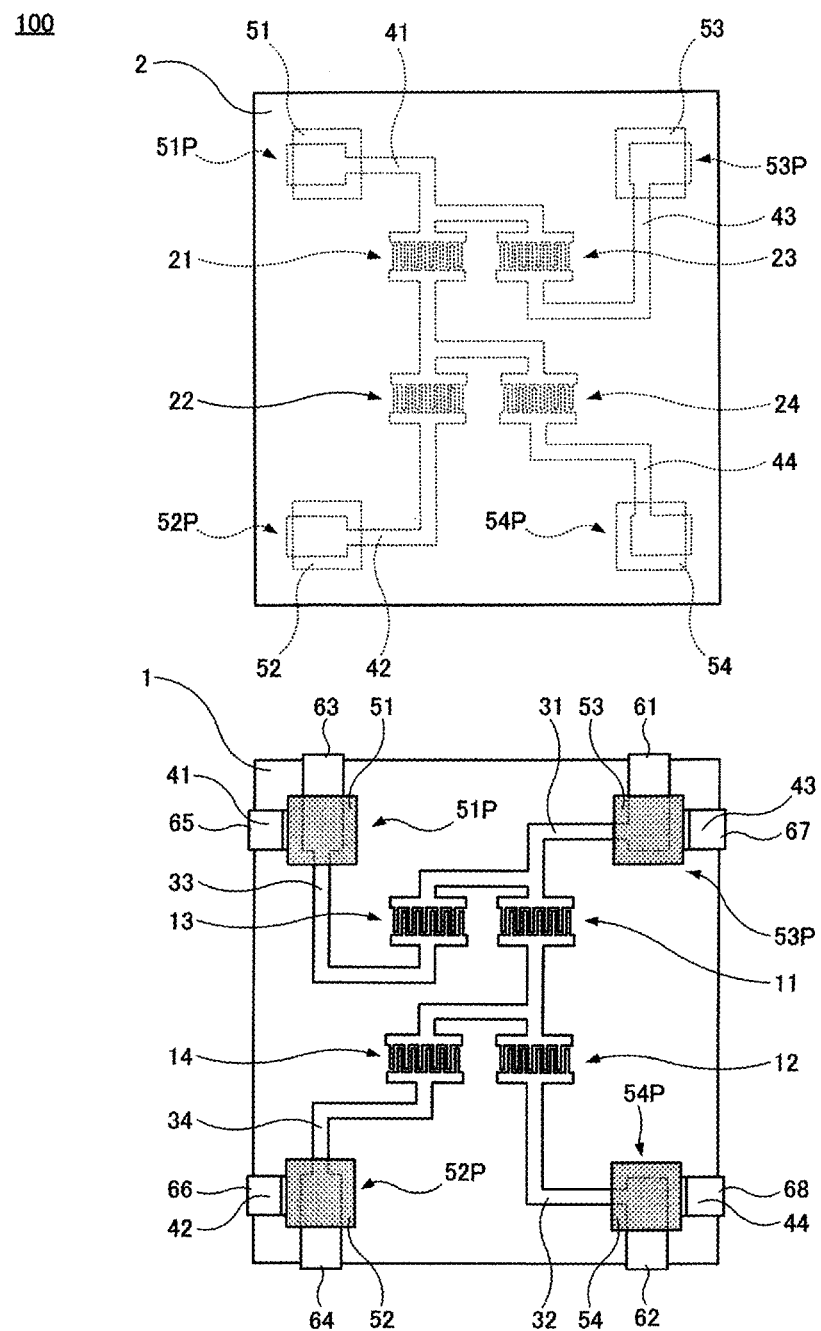
FIG. 3 is a plan view of each of two stacked element substrates of the acoustic wave device 100.

FIGS. 1 to 3 illustrate an acoustic wave device 100 according to a first preferred embodiment of the present invention. FIG. 1 is a perspective view of the acoustic wave device 100. FIG. 2 is a sectional view of the acoustic wave device 100, the view illustrating a section taken along a broken line X-X in FIG. 1. FIG. 3 is a plan view of each of a first element substrate 1 and a second element substrate 2 stacked one above the other and defining the acoustic wave device 100.

The acoustic wave device 100 includes the first element substrate 1 and the second element substrate 2. Each of the first element substrate 1 and the second element substrate 2 has piezoelectricity and is preferably made of, for example, an LT substrate (lithium tantalate single-crystal substrate), an LN substrate (lithium niobate single-crystal substrate), or a quartz substrate. Each of the first element substrate 1 and the second element substrate 2 may preferably include a layer made of a piezoelectric material, instead of being entirely made of a piezoelectric material.

In the first element substrate 1, a lower principal surface when viewed in FIGS. 1 and 2 is a mounting principal surface.

In the first element substrate 1, an upper principal surface when viewed in FIGS. 1 and 2 is a functional principal surface.

In the second element substrate 2, a lower principal surface when viewed in FIGS. 1 and 2 is a functional principal surface.

In the present preferred embodiment, nothing is provided on an upper principal surface of the second element substrate 2 when viewed in FIGS. 1 and 2.

As described above, FIG. 3 is a plan view of each of the first element substrate 1 and the second element substrate 2 stacked one above the other. The lower plan view in FIG. 3 shows the functional principal surface of the first element substrate 1. The upper plan view in FIG. 3 shows the functional principal surface of the second element substrate 2 when viewing the second element substrate 2 from the side facing the upper principal surface in a seeing-through manner.

Four sets of IDT electrodes (first IDT electrodes) 11, 12, 13 and 14 are provided on the functional principal surface of the first element substrate 1. The IDT electrodes 11 to 14 define resonators Re11 to Re14, respectively.

Four sets of IDT electrodes (second IDT electrodes) 21, 22, 23 and 24 are provided on the functional principal surface of the second element substrate 2. The IDT electrodes 21 to 24 define resonators Re21 to Re24, respectively.

The IDT electrodes 11 to 14 and 21 to 24 are each made of any desired material. For example, the IDT electrode may preferably be made of a metal selected from among Pt, Au, Ag, Cu, Ni, W, Ta, Fe, Cr, Al and Pd, or an alloy containing one or more of those metals. The IDT electrodes 11 to 14 and 21 to 24 may have a multilayer structure including a plurality of types of metals or alloys selected from among the above-described examples.

Four wiring electrodes (first wiring electrodes) 31 to 34 extend from the IDT electrodes 11 to 14, respectively, which are provided on the first element substrate 1.

Four wiring electrodes (second wiring electrodes) 41 to 44 extend from the IDT electrodes 21 to 24, respectively, which are provided on the second element substrate 2.

The wiring electrodes 31 to 34 and 41 to 44 are each made of any desired material. For example, the wiring electrode may preferably be made of Al. A close contact layer made of Ti, for example, may be disposed under Al.

The first element substrate 1 and the second element substrate 2 are bonded to each other by four divided bonding layers 51, 52, 53 and 54. The bonding layers 51 to 54 are each preferably made of a photosensitive resin containing, for example, a polyimide resin or an epoxy resin as a component.

Eight external connection electrodes 61 to 68 are provided on end surfaces and a bottom surface (mounting surface) of the first element substrate 1.

A bump 7 is provided on the underside of each of the external connection electrodes 61 to 68. The bump 7 is preferably made of, for example, a solder or Au.

The wiring electrodes 31 to 34 on the first element substrate 1 are connected respectively to the external connection electrodes 61 to 64. More specifically, the wiring electrode 31 is connected to the external connection electrode 61 after passing under the bonding layer 53. The wiring electrode 32 is connected to the external connection electrode 62 after passing under the bonding layer 54. The wiring electrode 33 is connected to the external connection electrode 63 after passing under the bonding layer 51. The wiring electrode 34 is connected to the external connection electrode 64 after passing under the bonding layer 52.

The wiring electrodes 41 to 44 on the second element substrate 2 are connected respectively to the external connection electrodes 65 to 68. More specifically, the wiring electrode 41 is connected to the external connection electrode 65 after passing above the bonding layer 51, over a lateral surface of the bonding layer 51, and over the upper principal surface of the first element substrate 1. The wiring electrode 42 is connected to the external connection electrode 66 after passing above the bonding layer 52, over a lateral surface of the bonding layer 52, and over the upper principal surface of the first element substrate 1. The wiring electrode 43 is connected to the external connection electrode 67 after passing above the bonding layer 53, over a lateral surface of the bonding layer 53, and over the upper principal surface of the first element substrate 1. The wiring electrode 44 is connected to the external connection electrode 68 after passing above the bonding layer 54, over a lateral surface of the bonding layer 54, and over the upper principal surface of the first element substrate 1.

Because the wiring electrode 33 is provided on the lower side of the bonding layer 51 and the wiring electrode 41 is provided on the upper side of the bonding layer 51, a wiring electrode overlapped portion 51P is defined with the bonding layer 51 interposed between the wiring electrodes 33 and 41.

Because the wiring electrode 34 is provided on the lower side of the bonding layer 52 and the wiring electrode 42 is provided on the upper side of the bonding layer 52, a wiring electrode overlapped portion 52P is defined with the bonding layer 52 interposed between the wiring electrodes 34 and 42.

Because the wiring electrode 31 is provided on the lower side of the bonding layer 53 and the wiring electrode 43 is provided on the upper side of the bonding layer 53, a wiring electrode overlapped portion 53P is defined with the bonding layer 53 interposed between the wiring electrodes 31 and 43.

Because the wiring electrode 32 is provided on the lower side of the bonding layer 54 and the wiring electrode 44 is provided on the upper side of the bonding layer 54, a wiring electrode overlapped portion 54P is defined with the bonding layer 52 interposed between the wiring electrodes 32 and 44.

Figure 4:
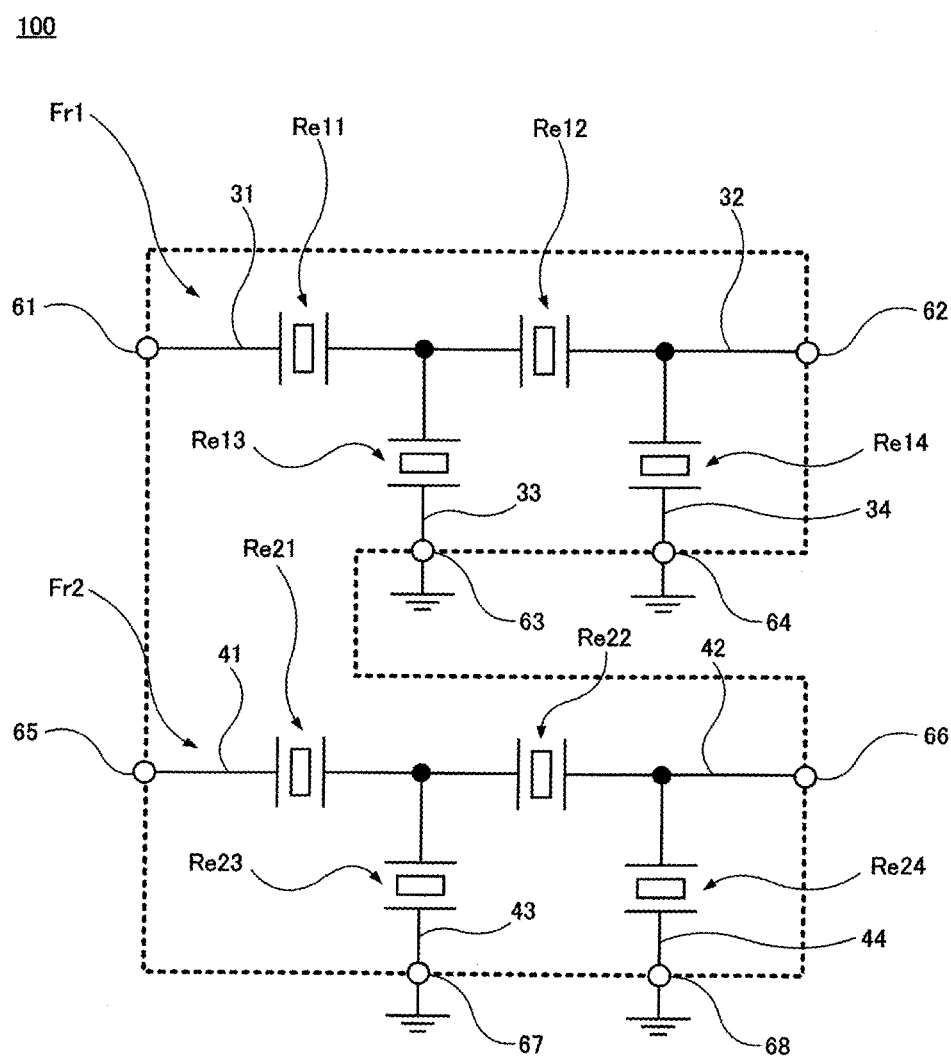
FIG. 4 is an equivalent circuit diagram of the acoustic wave device 100.

The acoustic wave device 100 with the above-described structure according to the first preferred embodiment has an equivalent circuit illustrated in FIG. 4.

The acoustic wave device 100 defines a filter array including two independent filters, i.e., a first filter Fr1 and a second filter Fr2.

The first filter Fr1 is preferably a ladder filter including the resonators Re11 to Re14.

In the first filter Fr1, the resonator Re11 and the resonator Re12 are connected in series between the external connection electrode 61 and the external connection electrode 62. The external connection electrode 61 and the resonator Re11 are connected by the wiring electrode 31. The resonator Re12 and the external connection electrode 62 are connected by the wiring electrode 32.

The resonator Re13 is connected between a junction point between the resonator Re11 and the resonator Re12 and a ground. The resonator Re13 and the ground are connected through the wiring electrode 33 and the external connection electrode 63.

The resonator Re14 is connected between a junction point between the resonator Re12 and the external connection electrode 62 and the ground. The resonator Re14 and the ground are connected through the wiring electrode 34 and the external connection electrode 64.

The second filter Fr2 is preferably a ladder filter including the resonators Re21 to Re24.

In the second filter Fr2, the resonator Re21 and the resonator Re22 are connected in series between the external connection electrode 65 and the external connection electrode 66. The external connection electrode 65 and the resonator Re21 are connected by the wiring electrode 41. The resonator Re22 and the external connection electrode 66 are connected by the wiring electrode 42.

The resonator Re23 is connected between a junction point between the resonator Re21 and the resonator Re22 and the ground. The resonator Re23 and the ground are connected through the wiring electrode 43 and the external connection electrode 67.

The resonator Re24 is connected between a junction point between the resonator Re22 and the external connection electrode 66 and the ground. The resonator Re24 and the ground are connected through the wiring electrode 44 and the external connection electrode 68.

As seen from FIG. 4, the wiring electrode 31, the wiring electrode 32, the wiring electrode 41, and the wiring electrode 42 are each a signal wiring electrode through which a signal passes. On the other hand, the wiring electrode 33, the wiring electrode 34, the wiring electrode 43, and the wiring electrode 44 are each a ground wiring electrode one end of which is connected to the ground.

In the wiring electrode overlapped portion 51P described above, the wiring electrode 33 is provided on the lower side of the bonding layer 51, and the wiring electrode 41 is provided on the upper side of the bonding layer 51. Thus, the wiring electrode 33 and the wiring electrode 41 overlap with each other when viewed in plan. However, a possibility of the occurrence of signal interference between the wiring electrode 33 and the wiring electrode 41 is small because the wiring electrode 33 is the ground wiring electrode and the wiring electrode 41 is the signal wiring electrode.

In the wiring electrode overlapped portion 52P, the wiring electrode 34 is provided on the lower side of the bonding layer 52, and the wiring electrode 42 is provided on the upper side of the bonding layer 52. Thus, the wiring electrode 34 and the wiring electrode 42 overlap with each other when viewed in plan. However, a possibility of the occurrence of signal interference between the wiring electrode 34 and the wiring electrode 42 is small because the wiring electrode 34 is the ground wiring electrode and the wiring electrode 42 is the signal wiring electrode.

In the wiring electrode overlapped portion 53P, the wiring electrode 31 is provided on the lower side of the bonding layer 53, and the wiring electrode 43 is provided on the upper side of the bonding layer 53. Thus, the wiring electrode 31 and the wiring electrode 43 overlap with each other when viewed in plan. However, a possibility of the occurrence of signal interference between the wiring electrode 31 and the wiring electrode 43 is small because the wiring electrode 31 is the signal wiring electrode and the wiring electrode 43 is the ground wiring electrode.

In the wiring electrode overlapped portion 54P, the wiring electrode 32 is provided on the lower side of the bonding layer 54, and the wiring electrode 44 is provided on the upper side of the bonding layer 54. Thus, the wiring electrode 32 and the wiring electrode 44 overlap with each other when viewed in plan. However, a possibility of the occurrence of signal interference between the wiring electrode 32 and the wiring electrode 44 is small because the wiring electrode 32 is the signal wiring electrode and the wiring electrode 44 is the ground wiring electrode.

As described above, the acoustic wave device 100 according to the first preferred embodiment includes the first element substrate 1 having piezoelectricity in at least a portion thereof, the first IDT electrodes 11 to 14 provided on one principal surface of the first element substrate 1, the second element substrate 2 stacked on the first element substrate 1 and having piezoelectricity in at least a portion thereof, the second IDT electrodes 21 to 24 provided on one principal surface of the second element substrate 2, the bonding layers 51 to 54 each made of an insulator and provided between the first element substrate 1 and the second element substrate 2, the first wiring electrodes 31 to 34 extending from the first IDT electrodes 11 to 14, and the second wiring electrodes 41 to 44 extending from the second IDT electrodes 21 to 24, the second wiring electrodes 41 to 44 extending to at least the one principal surface of the first element substrate 1 after passing over the lateral surfaces or through the insides of the bonding layers 51 to 54.

To explain in more detail, in the acoustic wave device 100, the principal surface of the first element substrate 1 on which the first IDT electrodes 11 to 14 are provided and the principal surface of the second element substrate 2 on which the second IDT electrodes 21 to 24 are provided are opposed to each other with the bonding layers 51 to 54 interposed therebetween.

Furthermore, the first wiring electrodes 31 to 34 are provided on the principal surface of the first element substrate 1 on which the first IDT electrodes 11 to 14 are provided. The second wiring electrodes 41 to 44 are provided on the principal surface of the second element substrate 1 on which the second IDT electrodes 21 to 24 are provided, on the lateral surface or inside the bonding layers 51 to 54, and on the principal surface of the first element substrate 1 on which the first IDT electrodes 11 to 14 are provided.

The first wiring electrodes 31 to 34 and the second wiring electrodes 41 to 44 are connected, respectively, to the external connection electrodes 61 to 68 provided on the first element substrate 1. The external connection electrodes 61 to 68 are each provided on the end surface of the first element substrate and on the principal surface thereof on which the first IDT electrodes 11 to 14 are not provided.

Moreover, in the acoustic wave device 100, as described above, the wiring electrode 33 and the wiring electrode 41 overlap with each other when viewed in plan, but the possibility of the occurrence of signal interference between the wiring electrode 33 and the wiring electrode 41 is small because the wiring electrode 33 is the ground wiring electrode and the wiring electrode 41 is the signal wiring electrode. The wiring electrode 34 and the wiring electrode 42 overlap with each other when viewed in plan, but the possibility of the occurrence of signal interference between the wiring electrode 34 and the wiring electrode 42 is small because the wiring electrode 34 is the ground wiring electrode and the wiring electrode 42 is the signal wiring electrode. The wiring electrode 31 and the wiring electrode 43 overlap with each other when viewed in plan, but the possibility of the occurrence of signal interference between the wiring electrode 31 and the wiring electrode 43 is small because the wiring electrode 31 is the signal wiring electrode and the wiring electrode 43 is the ground wiring electrode. The wiring electrode 32 and the wiring electrode 44 overlap with each other when viewed in plan, but the possibility of the occurrence of signal interference between the wiring electrode 32 and the wiring electrode 44 is small because the wiring electrode 32 is the signal wiring electrode and the wiring electrode 44 is the ground wiring electrode. Thus, in the acoustic wave device 100, the possibility of the occurrence of signal interference is small in any of the four wiring electrode overlapped portions 51P to 54P. In the acoustic wave device 100, therefore, electrical characteristics are unlikely to degrade due to the signal interference. Moreover, an electronic device including the acoustic wave device 100 is unlikely to malfunction due to the signal interference inside the acoustic wave device 100.

The acoustic wave device 100 according to the first preferred embodiment may be fabricated, for example, in accordance with the following non-limiting example of a manufacturing method.

First, the first element substrate 1 and the second element substrate 2 are individually prepared.

Then, the IDT electrodes 11 to 14 are formed on the functional principal surface of the first element substrate 1 by a photolithography technique, for example. Similarly, the IDT electrodes 21 to 24 are formed on the functional principal surface of the second element substrate 2 by the photolithography technique, for example.

Then, the wiring electrodes 31 to 34, the wiring electrodes 41 to 44, and the external connection electrodes 61 to are formed on the first element substrate 1 by the photolithography technique, for example. Similarly, the wiring electrodes 41 to 44 are formed on the second element substrate 2 by the photolithography technique, for example.

Then, a photosensitive resin is coated and solidified on the functional principal surface of the first element substrate 1, thus forming the four bonding layers 51 to 54.

Then, the second element substrate 2 is bonded to the bonding layers 51 to 54, which are formed on the functional principal surface of the first element substrate 1, using an adhesive (not illustrated), for example.

Then, by a suitable method such as sputtering, CVD, or vapor deposition, for example, the wiring electrode 41 is formed on the lateral surface of the bonding layer 51, the wiring electrode 42 is formed on the lateral surface of the bonding layer 52, the wiring electrode 43 is formed on the lateral surface of the bonding layer 53, and the wiring electrode 44 is formed on the lateral surface of the bonding layer 54. The wiring electrode 41 formed on the lateral surface of the bonding layer 51 interconnects the wiring electrode 41 formed on the first element substrate 1 and the wiring electrode 41 formed on the second element substrate 2. The wiring electrode 42 formed on the lateral surface of the bonding layer 52 interconnects the wiring electrode 42 formed on the first element substrate 1 and the wiring electrode 42 formed on the second element substrate 2. The wiring electrode 43 formed on the lateral surface of the bonding layer 53 interconnects the wiring electrode 43 formed on the first element substrate 1 and the wiring electrode 43 formed on the second element substrate 2. The wiring electrode 44 formed on the lateral surface of the bonding layer 54 interconnects the wiring electrode 44 formed on the first element substrate 1 and the wiring electrode 44 formed on the second element substrate 2.

Finally, the acoustic wave device 100 according to the first preferred embodiment is completed by forming, at the mounting principal surface side of the first element substrate 1, the bump 7 on the underside of each of the external connection electrodes 61 to 68 with a stud bump method, for example.

Second Preferred Embodiment

Figure 5:
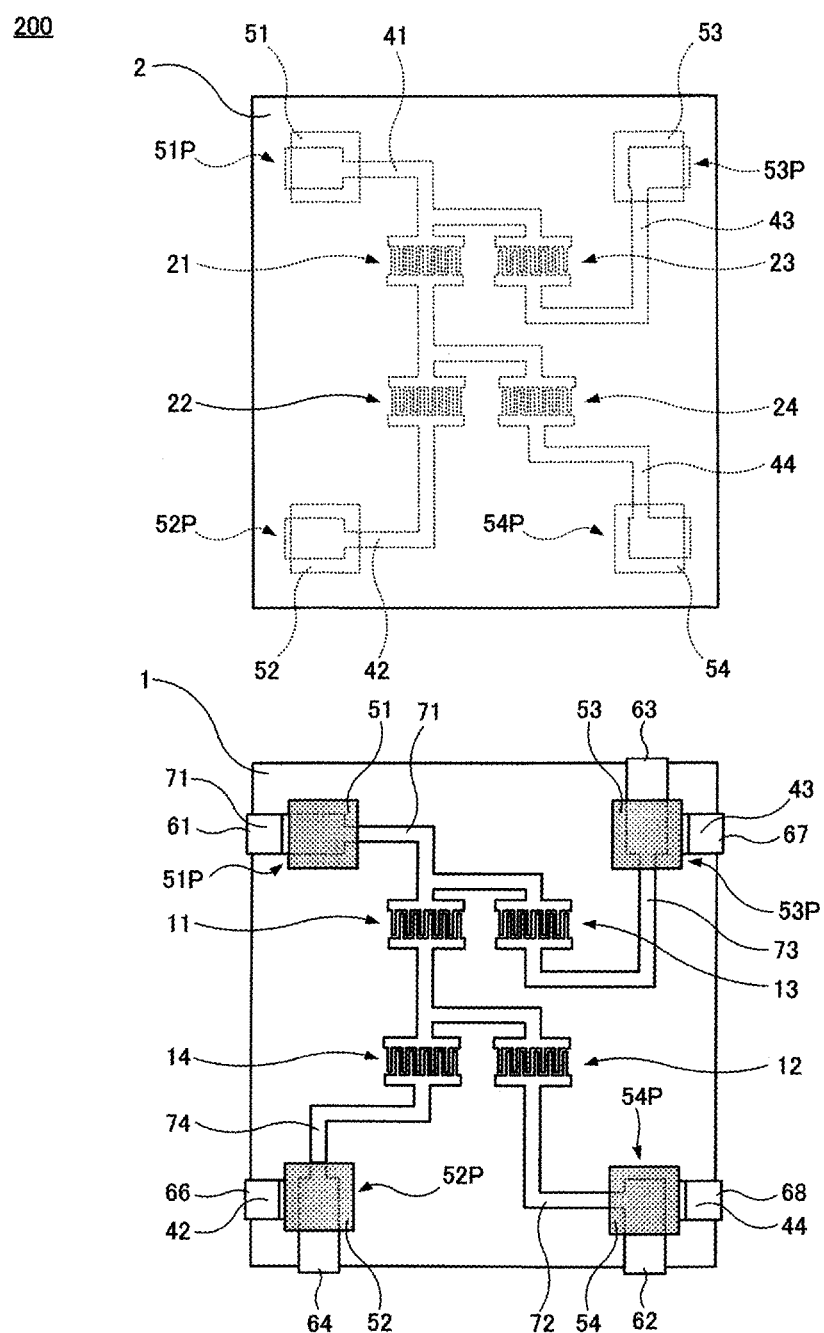
FIG. 5 is a plan view of each of two stacked element substrates of an acoustic wave device 200 according to a second preferred embodiment of the present invention.
Figure 6:
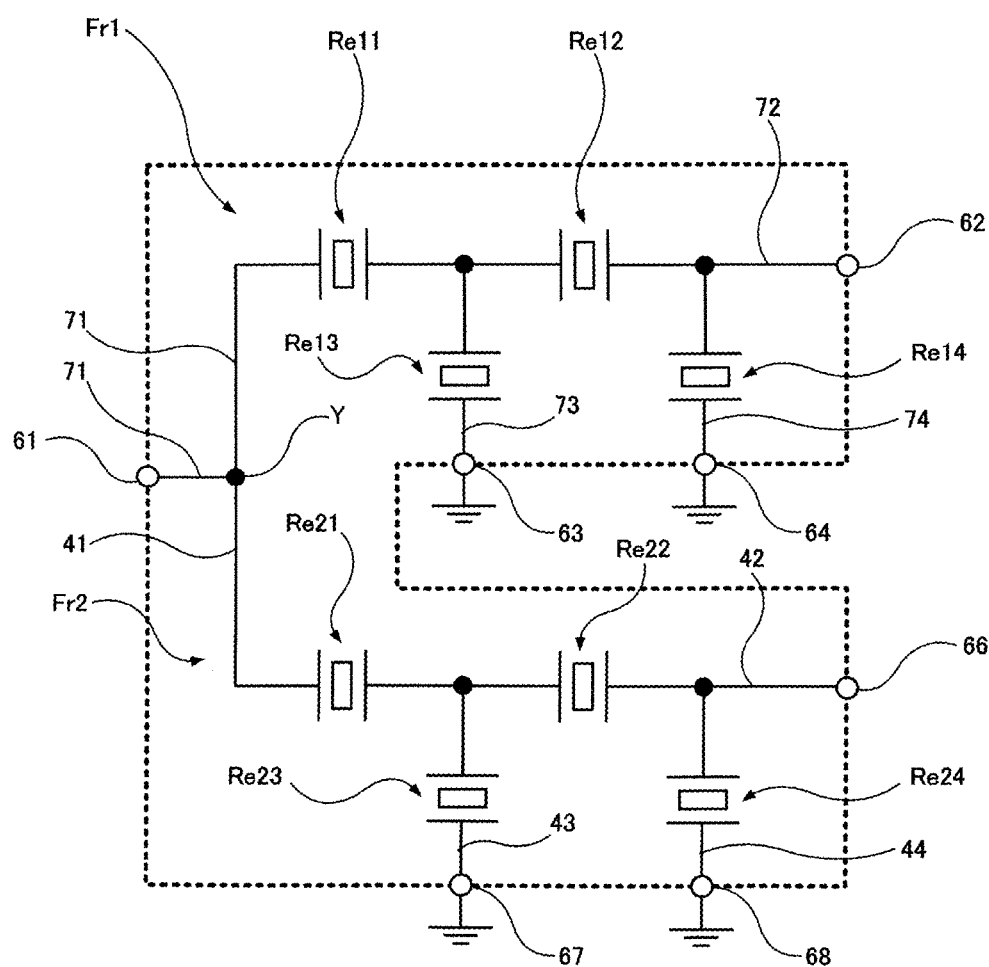
FIG. 6 is an equivalent circuit diagram of the acoustic wave device 200.

FIG. 5 illustrates an acoustic wave device 200 according to a second preferred embodiment of the present invention. FIG. 5 is a plan view of each of a first element substrate 1 and a second element substrate 2 defining the acoustic wave device 200. FIG. 6 illustrates an equivalent circuit of the acoustic wave device 200.

In the acoustic wave device 200, the structure of the acoustic wave device 100 according to the first preferred embodiment is partially modified. More specifically, in the acoustic wave device 200, the positions of the IDT electrodes 11 to 14, which are provided on the functional principal surface of the first element substrate 1 of the acoustic wave device 100, are modified. While the wiring electrodes 31 to 34 extend respectively from the IDT electrodes 11 to 14 in the acoustic wave device 100, wiring electrodes 71 to 74, instead of the wiring electrodes 31 to 34, extend respectively from the IDT electrodes 11 to 14 in the acoustic wave device 200. Furthermore, in the acoustic wave device 200, the external connection electrode 65 in the acoustic wave device 100 is omitted. Moreover, in the acoustic wave device 200, the positions of the external connection electrodes 61 and 63 are modified from those in the acoustic wave device 100.

While the acoustic wave device 100 includes a filter array including two independent filters, i.e., the first filter Fr1 and the second filter Fr2, the acoustic wave device 200 after the above-described modification defines a duplexer (multiplexer) including the first filter Fr1 and the second filter Fr2. The acoustic wave device 200 will be described below mainly about points modified from the acoustic wave device 100.

As illustrated in FIG. 5, the four sets of IDT electrodes 11, 12, 13 and 14 are provided on the functional principal surface of the first element substrate 1. The IDT electrodes 11 to 14 define the resonators Re11 to Re14, respectively. Four wiring electrodes 71 to 74 extend from the IDT electrodes 11 to 14, respectively, which are provided on the first element substrate 1.

The functional principal surface of the second element substrate 2 is not modified from the functional principal surface of the second element substrate 2 in the acoustic wave device 100 according to the first preferred embodiment, and the IDT electrodes 21 to 24 and the wiring electrodes 41 to 44 are provided thereon.

The wiring electrodes 71 to 74 on the first element substrate 1 are connected respectively to the external connection electrodes 61 to 64. More specifically, the wiring electrode 71 is connected to the external connection electrode 61 after passing under the bonding layer 51. The wiring electrode 72 is connected to the external connection electrode 62 after passing under the bonding layer 54. The wiring electrode 73 is connected to the external connection electrode 63 after passing under the bonding layer 53. The wiring electrode 74 is connected to the external connection electrode 64 after passing under the bonding layer 52.

The wiring electrodes 41 to 44 on the second element substrate 2 are connected respectively to the external connection electrodes 61 and 66 to 68. More specifically, the wiring electrode 41 is connected to the external connection electrode 61 after passing above the bonding layer 51, over the lateral surface of the bonding layer 51, and further through the wiring electrode 71 on the upper principal surface of the first element substrate 1. Thus, the wiring electrode 41 is connected halfway to the wiring electrode 71 and is further connected to the external connection electrode 61 through the wiring electrode 71. The wiring electrode 42 is connected to the external connection electrode 66 after passing above the bonding layer 52, over the lateral surface of the bonding layer 52, and over the upper principal surface of the first element substrate 1. The wiring electrode 43 is connected to the external connection electrode 67 after passing above the bonding layer 53, over the lateral surface of the bonding layer 53, and over the upper principal surface of the first element substrate 1. The wiring electrode 44 is connected to the external connection electrode 68 after passing above the bonding layer 54, over the lateral surface of the bonding layer 54, and over the upper principal surface of the first element substrate 1.

In the wiring electrode overlapped portion 51P, the wiring electrode 71 is provided on the lower side of the bonding layer 51, and the wiring electrode 41 is provided on the upper side of the bonding layer 51. Thus, the wiring electrode 71 and the wiring electrode 41 overlap with each other.

In the wiring electrode overlapped portion 52P, the wiring electrode 74 is provided on the lower side of the bonding layer 52, and the wiring electrode 42 is provided on the upper side of the bonding layer 52. Thus, the wiring electrode 74 and the wiring electrode 42 overlap with each other.

In the wiring electrode overlapped portion 53P, the wiring electrode 73 is provided on the lower side of the bonding layer 53, and the wiring electrode 43 is provided on the upper side of the bonding layer 53. Thus, the wiring electrode 73 and the wiring electrode 43 overlap with each other.

In the wiring electrode overlapped portion 54P, the wiring electrode 72 is provided on the lower side of the bonding layer 54, and the wiring electrode 44 is provided on the upper side of the bonding layer 54. Thus, the wiring electrode 72 and the wiring electrode 44 overlap with each other.

The acoustic wave device 200 with the above-described structure according to the second preferred embodiment has an equivalent circuit illustrated in FIG. 6 as mentioned above.

The acoustic wave device 200 includes a first filter Fr1 and a second filter Fr2.

The first filter Fr1 is preferably a ladder filter including the resonators Re11 to Re14.

In the first filter Fr1, the resonator Re11 and the resonator Re12 are connected in series between the external connection electrode 61 and the external connection electrode 62. The external connection electrode 61 and the resonator Re11 are connected by the wiring electrode 71. The resonator Re12 and the external connection electrode 62 are connected by the wiring electrode 72. Halfway or approximately halfway along the wiring electrode 71, a junction point Y at which the wiring electrode 71 is connected to the wiring electrode 41 is provided.

The resonator Re13 is connected between a junction point between the resonator Re11 and the resonator Re12 and the ground. The resonator Re13 and the ground are connected through the wiring electrode 73 and the external connection electrode 63.

The resonator Re14 is connected between a junction point between the resonator Re12 and the external connection electrode 62 and the ground. The resonator Re14 and the ground are connected through the wiring electrode 74 and the external connection electrode 64.

The second filter Fr2 is preferably a ladder filter including the resonators Re21 to Re24.

In the second filter Fr2, the resonator Re21 and the resonator Re22 are connected in series between the external connection electrode 61 and the external connection electrode 66. The external connection electrode 61 and the resonator Re21 are connected through the wiring electrode 71, the junction point Y, and the wiring electrode 41. The resonator Re22 and the external connection electrode 66 are connected by the wiring electrode 42.

The resonator Re23 is connected between a junction point between the resonator Re21 and the resonator Re22 and the ground. The resonator Re23 and the ground are connected through the wiring electrode 43 and the external connection electrode 67.

The resonator Re24 is connected between a junction point between the resonator Re22 and the external connection electrode 66 and the ground. The resonator Re24 and the ground are connected through the wiring electrode 44 and the external connection electrode 68.

As seen from FIG. 6, the wiring electrode 71, the wiring electrode 72, the wiring electrode 41, and the wiring electrode 42 are each a signal wiring electrode through which a signal passes. On the other hand, the wiring electrode 73, the wiring electrode 74, the wiring electrode 43, and the wiring electrode 44 are each a ground wiring electrode one end of which is connected to the ground.

In the wiring electrode overlapped portion 51P described above, the wiring electrode 71 is provided on the lower side of the bonding layer 51, and the wiring electrode 41 is provided on the upper side of the bonding layer 51. Thus, the wiring electrode 71 and the wiring electrode 41 overlap with each other when viewed in plan. Although the wiring electrode 71 and the wiring electrode 41 are both the signal wiring electrodes, the wiring electrode 71 and the wiring electrode 41 are the signal wiring electrodes that are connected to each other at the junction point Y, and that are maintained at the same potential. Accordingly, a possibility of the occurrence of signal interference between the wiring electrode 71 and the wiring electrode 41 is small.

In the wiring electrode overlapped portion 52P, the wiring electrode 74 is provided on the lower side of the bonding layer 52, and the wiring electrode 42 is provided on the upper side of the bonding layer 52. Thus, the wiring electrode 74 and the wiring electrode 42 overlap with each other when viewed in plan. However, a possibility of the occurrence of signal interference between the wiring electrode 74 and the wiring electrode 42 is small because the wiring electrode 74 is the ground wiring electrode and the wiring electrode 42 is the signal wiring electrode.

In the wiring electrode overlapped portion 53P, the wiring electrode 73 is provided on the lower side of the bonding layer 53, and the wiring electrode 43 is provided on the upper side of the bonding layer 53. Thus, the wiring electrode 73 and the wiring electrode 43 overlap with each other when viewed in plan. However, a possibility of the occurrence of signal interference between the wiring electrode 73 and the wiring electrode 43 is small because the wiring electrode 73 and the wiring electrode 43 are both the ground wiring electrodes.

In the wiring electrode overlapped portion 54P, the wiring electrode 72 is provided on the lower side of the bonding layer 54, and the wiring electrode 44 is provided on the upper side of the bonding layer 54. Thus, the wiring electrode 72 and the wiring electrode 44 overlap with each other when viewed in plan. However, a possibility of the occurrence of signal interference between the wiring electrode 72 and the wiring electrode 44 is small because the wiring electrode 72 is the signal wiring electrode and the wiring electrode 44 is the ground wiring electrode.

As described above, the acoustic wave device 200 according to the second preferred embodiment includes the first element substrate 1 made of a piezoelectric material or including a layer made of a piezoelectric material, the first IDT electrodes 11 to 14 on one principal surface of the first element substrate 1, the second element substrate 2 stacked on the first element substrate 1 and made of a piezoelectric material or including a layer made of a piezoelectric material, the second IDT electrodes 21 to 24 on one principal surface of the second element substrate 2, the bonding layers 51 to 54 each made of an insulator and provided between the first element substrate 1 and the second element substrate 2, the first wiring electrodes 71 to 74 extending from the first IDT electrodes 11 to 14, and the second wiring electrodes 41 to 44 extending from the second IDT electrodes 21 to 24, the second wiring electrodes 41 to 44 extending to at least the one principal surface of the first element substrate 1 after passing over the lateral surfaces or through the insides of the bonding layers 51 to 54.

Moreover, in the acoustic wave device 200, as described above, the wiring electrode 71 and the wiring electrode 41 overlap with each other when viewed in plan and are both the signal wiring electrodes, but the possibility of the occurrence of signal interference between the wiring electrode 71 and the wiring electrode 41 is small because the wiring electrode 71 and the wiring electrode 41 are connected to each other at the junction point Y and are maintained at the same potential. The wiring electrode 74 and the wiring electrode 42 overlap with each other when viewed in plan, but the possibility of the occurrence of signal interference between the wiring electrode 74 and the wiring electrode 42 is small because the wiring electrode 74 is the ground wiring electrode and the wiring electrode 42 is the signal wiring electrode. The wiring electrode 73 and the wiring electrode 43 overlap with each other when viewed in plan, but the possibility of the occurrence of signal interference between the wiring electrode 73 and the wiring electrode 43 is small because the wiring electrode 73 and the wiring electrode 43 are both the ground wiring electrodes. The wiring electrode 72 and the wiring electrode 44 vertically overlap with each other when viewed in plan, but the possibility of the occurrence of signal interference between the wiring electrode 72 and the wiring electrode 44 is small because the wiring electrode 72 is the signal wiring electrode and the wiring electrode 44 is the ground wiring electrode. Thus, in the acoustic wave device 200, the possibility of the occurrence of signal interference is small in any of the four wiring electrode overlapped portions 51P to 54P. In the acoustic wave device 200, therefore, electrical characteristics are unlikely to degrade due to the signal interference. Moreover, an electronic device using the acoustic wave device 200 is unlikely to malfunction attributable to the signal interference inside the acoustic wave device 200.

Third Preferred Embodiment

Figure 7:
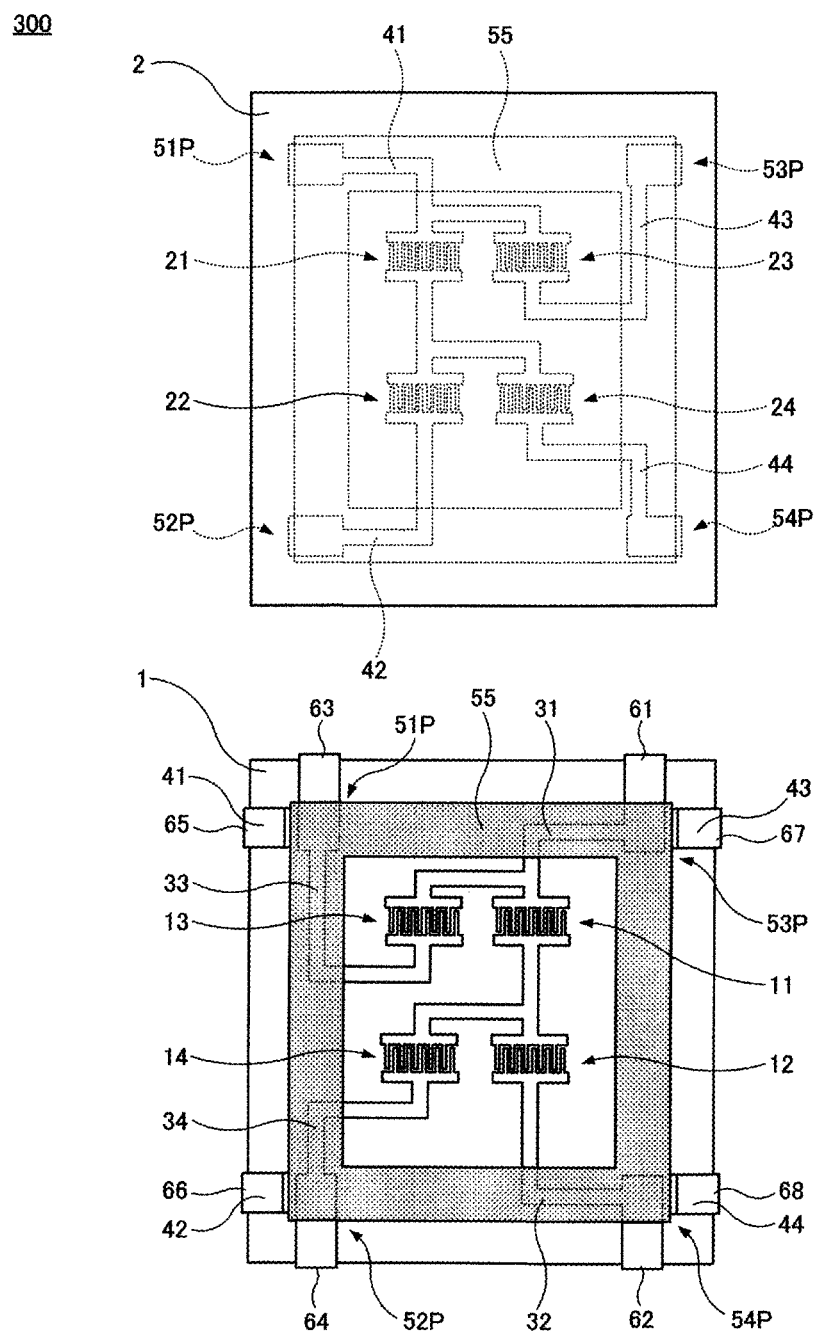
FIG. 7 is a plan view of each of two stacked element substrates of an acoustic wave device 300 according to a third preferred embodiment of the present invention.

FIG. 7 illustrates an acoustic wave device 300 according to a third preferred embodiment of the present invention. FIG. 7 is a plan view of each of a first element substrate 1 and a second element substrate 2 defining the acoustic wave device 300.

In the acoustic wave device 300, the structure of the acoustic wave device 100 according to the first preferred embodiment is partially modified. More specifically, while the first element substrate 1 and the second element substrate 2 are bonded to each other by the four bonding layers 51 to 54 in the acoustic wave device 100, the first element substrate 1 and the second element substrate 2 are bonded to each other by one annular bonding layer 55 in the acoustic wave device 300m instead of the four bonding layers 51 to 54.

In the acoustic wave device 300, an enclosed space is defined by the first element substrate 1, the second element substrate 2, and the bonding layer 55. In the acoustic wave device 300, the IDT electrodes 11 to 14 and 21 to 24 are provided in the enclosed space defined as mentioned above. Thus, the IDT electrodes 11 to 14 and 21 to 24 are protected from external environments (such as high humidity). Furthermore, when the surroundings of the acoustic wave device 300 are sealed using resin, the resin is prevented from reaching the IDT electrodes 11 to 14 and 21 to 24, and free vibrations of the IDT electrodes 11 to 14 and 21 to 24 are not impeded by the resin.

Fourth Preferred Embodiment

Figure 8:
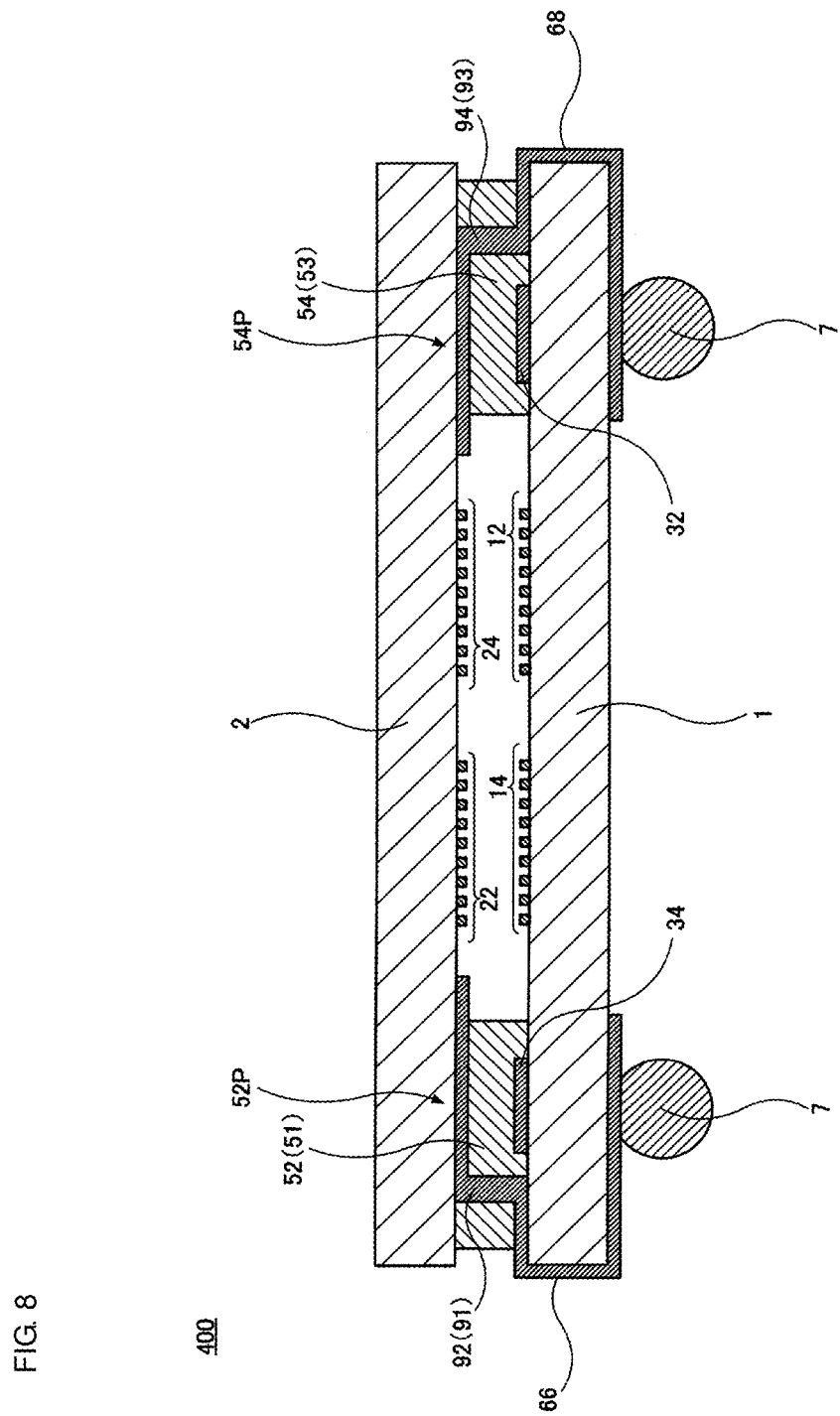
FIG. 8 is a sectional view of an acoustic wave device 400 according to a fourth preferred embodiment of the present invention.

FIG. 8 illustrates an acoustic wave device 400 according to a fourth preferred embodiment of the present invention. FIG. 8 is a sectional view of the acoustic wave device 400.

Also in the acoustic wave device 400, the structure of the acoustic wave device 100 according to the first preferred embodiment is partially modified. More specifically, in the acoustic wave device 100, the second wiring electrode 41 extends over the lateral surface of the bonding layer 51, the second wiring electrode 42 extends over the lateral surface of the bonding layer 52, the second wiring electrode 43 extends over the lateral surface of the bonding layer 53, and the second wiring electrode 44 extends over the lateral surface of the bonding layer 54. On the other hand, in the acoustic wave device 400, a second wiring electrode 91 extends through the inside of the bonding layer 51, a second wiring electrode 92 extends through the inside of the bonding layer 52, a second wiring electrode 93 extends through the inside of the bonding layer 53, and a second wiring electrode 94 extends through the inside of the bonding layer 54.

The second wiring electrodes 91 to 94 may preferably extend through the insides of the bonding layers 51 to 54 respectively by the following method, for example.

First, the bonding layers 51 to 54 are provided on an upper principal surface of the first element substrate 1 on which the IDT electrodes 11 to 14, the first wiring electrodes 31 to 34, and the second wiring electrodes 91 to 94 are provided. Then, vertically penetrating through-holes are provided in the bonding layers 51 to 54. At that time, the second wiring electrodes 91 to 94 on the upper principal surface of the first element substrate 1 are exposed at bottom surfaces of the corresponding through-holes.

Then, a conductive material, such as a conductive resin paste, for example, is filled into the through-holes. The filled conductive material defines and functions as each of the second wiring electrodes 91 to 94 extending through the insides of the bonding layers 51 to 54.

Then, a lower principal surface of the second element substrate 2 on which the IDT electrodes 21 to 24 and the second wiring electrodes 91 to 94 are provided is bonded to the bonding layers 51 to 54. Then, the second wiring electrodes 91 to 94 on the upper principal surface of the first element substrate 1 and the second wiring electrodes 91 to 94 on the lower principal surface of the second element substrate 2 are connected respectively by the conductive materials filled in the through-holes of the bonding layers 51 to 54. When the conductive material is a curable conductive resin paste, for example, the paste is cured at an appropriate time. As a result, the second wiring electrodes 91 to 94 is able to extend through the insides of the bonding layers 51 to 54, respectively.

Fifth Preferred Embodiment

Figure 9:
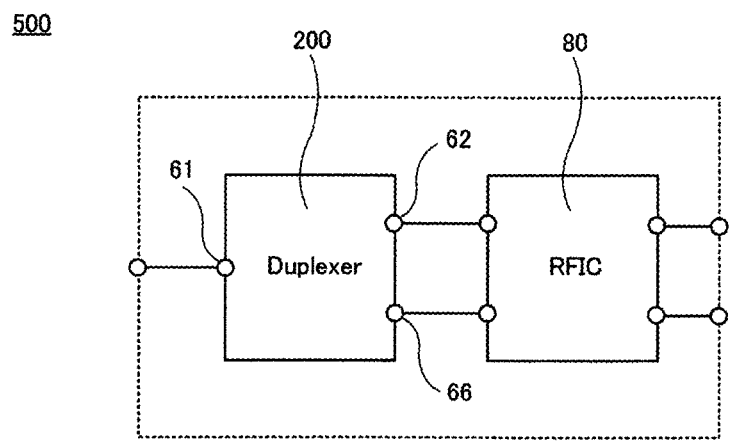
FIG. 9 is a block diagram of a radio frequency front-end module 500 according to a fifth preferred embodiment of the present invention.

FIG. 9 illustrates a radio frequency front-end module 500 according to a fifth preferred embodiment of the present invention. FIG. 9 is a block diagram of the radio frequency front-end module 500.

The radio frequency front-end module 500 has a configuration in which an RFIC 80 is connected to the acoustic wave device 200 according to the second preferred embodiment, which defines a duplexer (multiplexer).

By using the acoustic wave device 200, the radio frequency front-end module 500 is unlikely to malfunction due to the signal interference inside the acoustic wave device 200.

Sixth Preferred Embodiment

Figure 10:
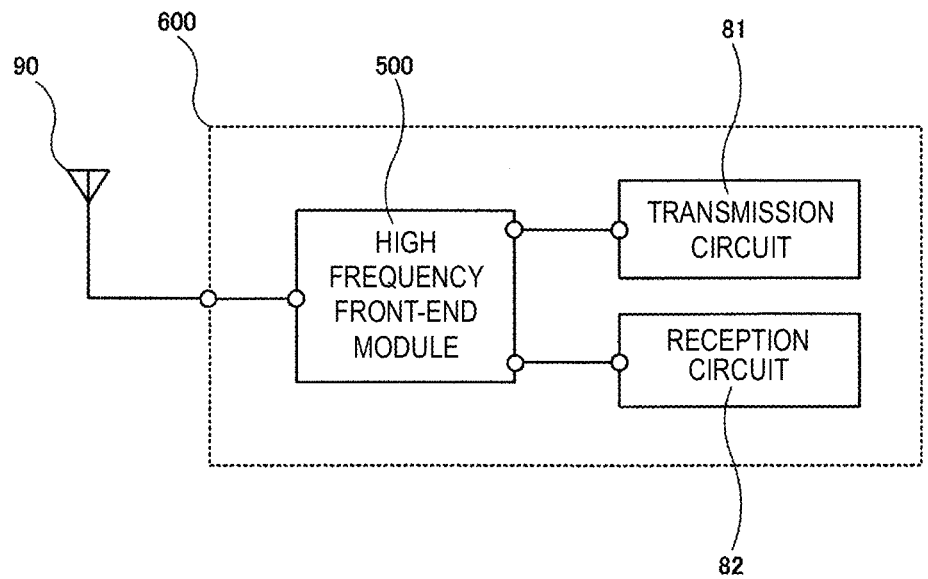
FIG. 10 is a block diagram of a communication device 600 according to a sixth preferred embodiment of the present invention.
Figure 11:
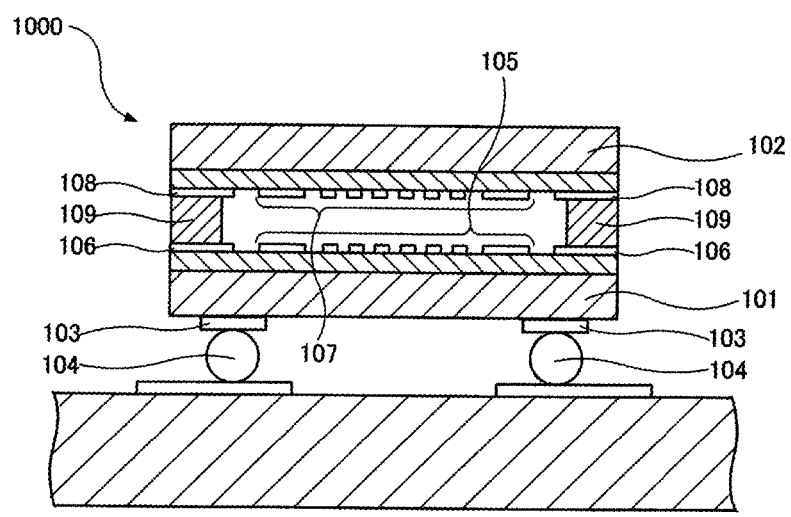
FIG. 11 is a sectional view of an acoustic wave device 1000 disclosed in Japanese Unexamined Patent Application Publication No. 2007-60465.

FIG. 10 illustrates a communication device 600 according to a sixth preferred embodiment of the present invention. FIG. 10 is a block diagram of the communication device 600.

The communication device 600 has a configuration in which a transmission circuit 81 and a reception circuit 82 are connected to the radio frequency front-end module 500 according to the fifth preferred embodiment. In use, an antenna 90 is connected to the communication device 600.

By using the radio frequency front-end module 500 that uses the acoustic wave device 200, the communication device 600 is unlikely to malfunction due to the signal interference inside the acoustic wave device 200.

The acoustic wave devices 100, 200, 300 and 400 according to the first to fourth preferred embodiments, the radio frequency front-end module 500 according to the fifth preferred embodiment, and the communication device 600 according to the sixth preferred embodiment have been described above. However, the acoustic wave devices, the radio frequency front-end modules, and the communication devices according to the present invention are not limited to the above-described preferred embodiments, and they may be variously modified within the scope not departing from the gist of the present invention.

For instance, the IDT electrodes 11 to 14 on the functional surface of the first element substrate 1 and the IDT electrodes 21 to 24 on the functional surface of the second element substrate 2 in the acoustic wave devices 100, 200, 300 and 400 are merely illustrative for the purpose of explaining preferred embodiments of the present invention. The number of and the connection structure for the IDT electrodes on each of the functional surface of the first element substrate 1 and the functional surface of the second element substrate 2 may be selected as required, and desired one of various variations may be optionally used.

While, in the acoustic wave devices 100, 200 and 300, the wiring electrodes 41 to 44 are provided on the lateral surfaces of the bonding layers 51 to 55, the wiring electrodes may be provided inside the bonding layers 51 to 55 as in the acoustic wave device 400.

While the four wiring electrode overlapped portions 51P to 54P are provided in each of the acoustic wave devices 100, 200, 300 and 400, the number of the wiring electrode overlapped portions may be optionally set, and it may be less than four or more than four.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a first element substrate having piezoelectricity in at least a portion thereof;
    a first IDT electrode provided on one principal surface of the first element substrate;
    a second element substrate stacked on the first element substrate and having piezoelectricity in at least a portion thereof;
    a second IDT electrode provided on one principal surface of the second element substrate;
    a bonding layer made of an insulator and provided between the first element substrate and the second element substrate;
    at least one first wiring electrode extending from the first IDT electrode; and
    at least one second wiring electrode extending from the second IDT electrode; wherein
    the at least one first wiring electrode is arranged so as not to contact the at least one second wiring electrode;
    the at least one second wiring electrode includes a second wiring electrode that extends separately from the at least one first wiring electrode to at least the one principal surface of the first element substrate after passing over a lateral surface or through inside of the bonding layer;
    the at least one first wiring electrode and the at least one second wiring electrode are provided in one of combinations of one wiring electrode is a signal wiring electrode and another wiring electrode is a ground wiring electrode, both of the wiring electrodes are ground wiring electrodes, and both of the wiring electrodes are signal wiring electrodes at the same potential;

the at least one first wiring electrode is provided between the first element substrate and the bonding layer;

the at least one second wiring electrode is provided between the second element substrate and the bonding layer; and in a plan view of the acoustic wave device, the at least one first wiring electrode and the at least one second wiring electrode overlap with each other in a region in which the bonding layer is provided.

2. The acoustic wave device according to claim 1, wherein the principal surface of the first element substrate on which the first IDT electrode is provided and the principal surface of the second element substrate on which the second IDT electrode is provided are opposed to each other with the bonding layer interposed therebetween.

3. The acoustic wave device according to claim 2, wherein the at least one first wiring electrode is provided at least on the principal surface of the first element substrate on which the first IDT electrode is provided; and the at least one second wiring electrode is provided at least on the principal surface of the second element substrate on which the second IDT electrode is provided, on the lateral surface of or inside the bonding layer, and on the principal surface of the first element substrate on which the first IDT electrode is provided.

4. The acoustic wave device according to claim 1, wherein the at least one first wiring electrode and the at least one second wiring electrode are each connected to an external connection electrode provided on the first element substrate.

5. The acoustic wave device according to claim 4, wherein the external connection electrode is provided at least on an end surface of the first element substrate and a principal surface of the first element substrate on which the first IDT electrode is not provided.

6. The acoustic wave device according to claim 1, wherein the bonding layer is divided into a plurality of bonding layers.

7. The acoustic wave device according to claim 1, wherein the bonding layer is an annular bonding layer.

8. The acoustic wave device according to claim 1, wherein the at least one first wiring electrode includes at least two first wiring electrodes;

the at least one second wiring electrode includes at least two second wiring electrodes;

the at least two first wiring electrodes and the at least two second wiring electrodes overlap with each other at a plurality of positions when viewed in plan; and at each of the plurality of positions, each of the at least two first wiring electrodes and each of the at least two second wiring electrodes are provided in one of combinations of one wiring electrode is a signal wiring electrode and the other wiring electrode is a ground wiring electrode, both of the wiring electrodes are ground wiring electrodes, and both of the wiring electrodes are signal wiring electrodes at the same potential.

9. The acoustic wave device according to claim 8, wherein a number of the plurality of positions is four.

10. The acoustic wave device according to claim 9, wherein the four positions are four corners of the acoustic wave device.

11. The acoustic wave device according to claim 1, wherein the acoustic wave device defines a filter array including a plurality of independent filters.

12. The acoustic wave device according to claim 1, wherein the acoustic wave device defines a multiplexer.

13. A radio frequency front-end module including the acoustic wave device according to claim 1.

14. A radio frequency front-end module including the acoustic wave device according to claim 2.

15. A radio frequency front-end module including the acoustic wave device according to claim 3.

16. A radio frequency front-end module including the acoustic wave device according to claim 4.

17. A radio frequency front-end module including the acoustic wave device according to claim 5.

18. A communication device including the acoustic wave device according to claim 1.

19. A communication device including the radio frequency front-end module according to claim 13.

* * * * *